(12) United States Patent
Ikeda

(10) Patent No.: US 7,906,380 B2
(45) Date of Patent: *Mar. 15, 2011

(54) ELECTRIC DEVICE HAVING NANOWIRES, MANUFACTURING METHOD THEREOF, AND ELECTRIC DEVICE ASSEMBLY

(75) Inventor: Sotomitsu Ikeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/686,951

(22) Filed: Jan. 13, 2010

(65) Prior Publication Data
US 2010/0112731 A1    May 6, 2010

Related U.S. Application Data

(62) Division of application No. 11/559,546, filed on Nov. 14, 2006, now Pat. No. 7,696,022.

(30) Foreign Application Priority Data

Dec. 6, 2005   (JP) .................................. 2005-352574

(51) Int. Cl.
*H01L 21/00* (2006.01)
(52) U.S. Cl. ......................................... 438/149; 977/938

(58) Field of Classification Search .......... 438/149–167, 438/197–230; 977/762, 789, 887–889
See application file for complete search history.

(56) References Cited

U.S. PATENT DOCUMENTS

| | | | |
|---|---|---|---|
| 6,340,822 B1 * | 1/2002 | Brown et al. ................... 257/25 |
| 6,872,645 B2 | 3/2005 | Duan et al. ..................... 438/584 |
| 7,696,022 B2 * | 4/2010 | Ikeda ............................. 438/149 |
| 2005/0079659 A1 * | 4/2005 | Duan et al. ..................... 438/197 |

FOREIGN PATENT DOCUMENTS
JP    H10-106960    4/1998

OTHER PUBLICATIONS

X. Duan et al., "High-performance thin-film transistors using semiconductor nanowires and nanoribbons", Nature, Sep. 18, 2003, 274-278, vol. 425, Nature Publishing Group, England.

* cited by examiner

*Primary Examiner* — Brook Kebede
(74) *Attorney, Agent, or Firm* — Fitzpatrick, Cella, Harper & Scinto

(57) ABSTRACT

An electric device having a plurality of nanowires, in which at least one of the nanowires is cut or changed in its electric characteristics so as to have a desired characteristic value of the electric device.

1 Claim, 4 Drawing Sheets

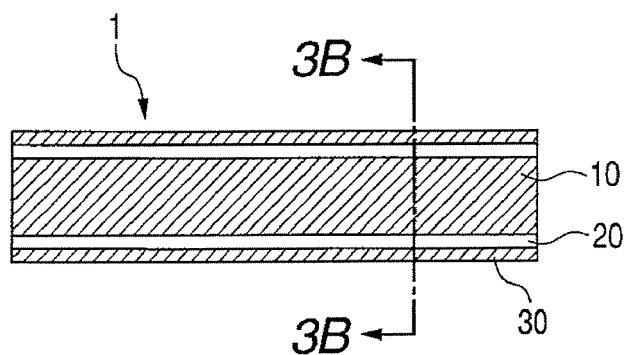
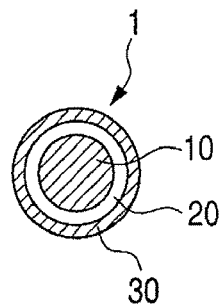
FIG. 3A  FIG. 3B
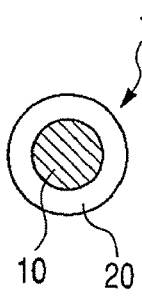
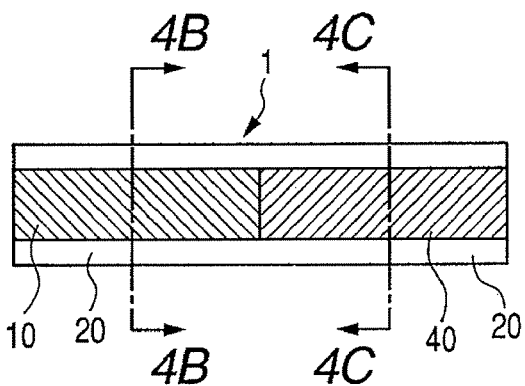
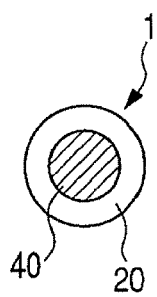
FIG. 4B  FIG. 4A  FIG. 4C
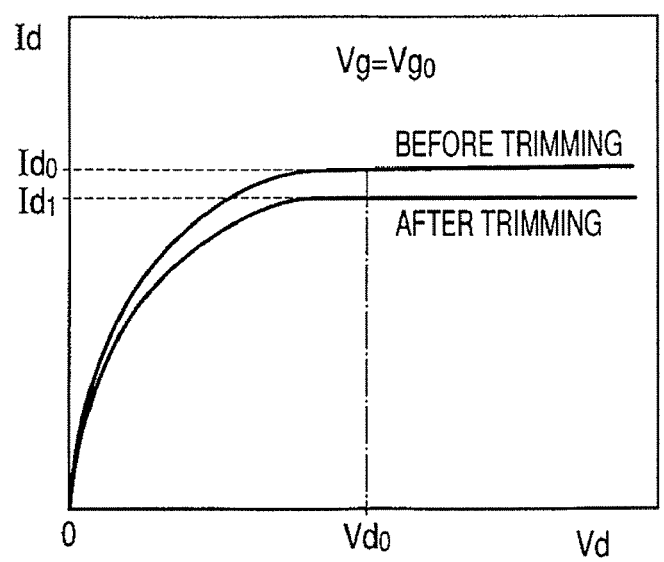
FIG. 5

ELECTRIC DEVICE HAVING NANOWIRES, MANUFACTURING METHOD THEREOF, AND ELECTRIC DEVICE ASSEMBLY

RELATED APPLICATIONS

This application is a division of U.S. patent application Ser. No. 11/559,546, filed Nov. 14, 2006, now U.S. Pat. No. 7,696,022 which is incorporated by reference herein in its entirety, as if fully set forth herein, and claims the benefit of priority under 35 U.S.C. §119, based on Japanese Patent Application No. 2005-352574, filed Dec. 6, 2005, which is incorporated by reference herein in its entirety, as if fully set forth herein.

BACKGROUND OF THE INVENTION

1. Field of the Invention

The present invention relates to an electric device having nanowires, a method of manufacturing such electric device, and an electric device assembly. In particular, the present invention relates to an electric device such as a TFT device that uses nanowires as conductive channels, and a method of manufacturing such electric device.

2. Description of the Related Art

A thin film transistor (TFT) is a switching device used in various electronic devices. Known transistor devices that constitute the TFT include silicon-based transistors (single crystal, polycrystal, and amorphous), compound semiconductor transistors (III-V group, II-VI group, and IV-IV group), and organic transistors (low molecular, and polymer).

Of those, silicon-based transistors, which use silicon for a semiconductor layer, have the following characteristics:

1) Their material, silicon, is infinitely abundant on the surface of the earth.

2) Doping can be used to build p-type and n-type structures.

3) An oxide of silicon $SiO_2$ can be used for forming a high quality dielectric film.

4) The carrier mobility is high (single crystal: up to $10^3$ $cm^2/Vs$, polycrystal: up to $10^2$ $cm^2/Vs$, amorphous: up to 1 $cm^2/Vs$), which leads to excellent transistor performance.

However, silicon-based transistors need a large-scale manufacturing facility and a huge apparatus for film formation in the device fabrication process through chemical vapor deposition, or other similar film forming methods, at high temperature under vacuum. Accordingly, cost reduction and process simplification are problems to be solved.

Compound semiconductor transistors are transistors that use for a semiconductor layer a compound (GaAs, SiC or the like) formed of a plurality of elements. Compound semiconductor transistors have much higher carrier mobility than that of silicon-based transistors, and exhibit various characteristics including low-power drive in high-frequency bands, photoreactivity, and microwave emission, depending on what compound is employed. Despite those diversity of characteristics, compound semiconductor transistors have limited uses since their materials are expensive and their device fabrication process is a large-scale, complicated process comparable to that of silicon-based transistors described above.

Organic transistors are transistors that use for a semiconductor layer an organic substance (pentacene and the like as a low-molecular weight organic substance, PEDOT (polyethylene dioxythiophene) and the like as a polymer organic substance). Organic transistors, especially polymer organic transistors, be produced by a coating process in forming a film, and are adaptable to simple, low-cost fabrication of devices in mass quantities through ink jet or roll-to-roll processes. However, organic transistors are significantly low in carrier mobility (up to 0.1 $cm^2/Vs$), which determines the performance of a transistor, compared to that of silicon-based transistors, and are said to require significant progress with regard to material and manufacture process for being applicable to various electronic devices.

As described, none of the prior art TFT devices has succeeded in having high transistor performance and in being obtainable by a simple, low-cost device fabrication process, and development of such a transistor has been desired. Nanowire TFTs are attracting attention as a next-generation TFT device that meets this demand.

Nanowire TFTs are TFTs that use nanowires having a high aspect ratio of a diameter of several nm to several hundreds nm and a length of several μm to one hundred μm, for a semiconductor layer, which connects a source electrode and a drain electrode in a transistor device. Nanowire TFTs that use nanowires of high crystallinity are expected to have high transistor performance. When the nanowire diameter is 5 nm or shorter, in particular, a quantum effect is brought about, so that higher performance such as a single electron transistor and high mobility can be expected. In addition, nanowire TFTs can be manufactured by a simple, low-cost device fabrication process since it merely requires orientation/arrangement control of nanowires on a substrate to build a TFT structure. Nanowire TFTs are therefore expected to embody a next-generation TFT having both a high transistor performance and being obtainable by a simple, low-cost device fabrication process, which has been unattainable with the conventional TFT technology.

Examples of channel materials to be used for field effect transistors using nanowires as a channel, which are at present under development, include: carbon nanotubes, Si nanowires, Ge nanowires; semiconductor materials including Group III-V compound semiconductors such as GaAs and InP, and Group II-VI compound semiconductors such as CdS.

A known nanowire synthesis method is, for example, the Vapor-Liquid-Solid (VLS) growth. Japanese Patent Application Laid-Open No. H10-106960, for example, discloses a silicon nanowire synthesis method. The first step of this method is to deposit gold onto a silicon wafer surface followed by heating in a silane gas atmosphere, thereby forming a molten alloy of silicon and gold on the silicon wafer surface. With the alloy working as a catalyst, the silane gas is decomposed and silicon nanowires grow.

The thus obtained silicon nanowires have significantly high crystallinity in the axial direction. The article on pages 274-278 of "Nature" vol. 425 issued Sep. 18, 2003 discloses that such nanowires, when used for a semiconductor layer in a TFT, give the TFT as high transistor performance as that of from polycrystalline silicon TFTs to single crystal silicon TFTs.

Also, as for a device fabrication method, nanowire TFTs can be manufactured by a coating method, in which nanowires are dispersed into a solution to be applied to a substrate. However, simply applying a nanowire solution to a substrate is not enough and has to be accompanied by orientation/arrangement control of each nanowire. The article on pages 274-278 of "Nature" vol. 425 issued Sep. 18, 2003 or U.S. Pat. No. 6,872,645 reports a technique of orienting/arranging nanowires by causing a nanowire solution to flow over a substrate. Forming nanowires by coating like this has process advantages such as being simple, low-cost, and fit for mass production.

In addition to the excellent TFT performance as described above, nanowire TFTs are characterized by being highly resistant against bending and by possibility of being manufactured by a normal pressure, normal temperature fabrication through a thoroughly liquid process. Accordingly, when formed on a plastic substrate such nanowire TFTs make it possible to form switching devices that have higher TFT performance than would ever be possible with conventional TFT technology as well as a sophisticated electrical processing circuit, on a flexible substrate through a low-cost process. For instance, in the case of TFT substrates for flat panel displays such as liquid crystal displays and organic EL displays, the silicon nanowire TFT technology makes it possible to fabricate a plurality of TFTs for each pixel and, furthermore, allows nanowire TFTs to constitute a driver circuit of a display peripheral circuit or the like. Flexible displays that have high image quality and can be driven at low power can thus be manufactured at low temperature.

Trimming is known as a method of modifying characteristics of electric devices. Trimming is commonly used in such electric devices as resistors, capacitors, and coils. A resistor is trimmed to reduce the width of the resistor or to change the effective length of the resistor, thereby raising the resistance value to a given level. A capacitor is trimmed to remove some of electrodes, thereby being capable of adjusting the capacitor by reducing the capacity.

Methods of trimming include, in addition to one that uses a laser beam, conventionally known methods such as sandblasting, one that uses a diamond rotary blade, electronic beam machining, ultrasonic machining, and anodization. Laser trimming, in particular, has the following advantages:

1) The lack of mechanical contact with an object to be worked on results in less contamination and damage to the object.

2) An object housed in a transparent package can be trimmed from outside of the package.

3) An object can be machined to have a minute width.

4) Resistors of high-density integrated circuits can be trimmed.

5) The precision and reproducibility are high.

6) A trimmed object causes little change with time.

Laser trimming is therefore suitable for trimming of electric devices, and the mainstream of electric device trimming is laser trimming using a YAG laser, a $CO_2$ laser, or the like. Laser trimming cannot be performed on TFT devices since it only makes TFT devices physically unusable.

There are two types of trimming: element trimming and functional trimming. Functional trimming, in which a printed resistor is trimmed to have the optimum resistance value while the overall circuit function is observed, is widely employed at present.

The nanowire TFTs described above are arranged by a simple process of causing a solution in which nanowires are dispersed to flow over a substrate and thus depositing nanowire TFTs. On the other hand, the simple process allows nanowires to be arranged irregularly, which leads to characteristics fluctuations. Causes of the irregular arrangement of nanowires include a fluctuation in number of effectively working nanowires, a fluctuation in length of the nanowires between source and drain electrodes due to deviation of the angle between the nanowires and the electrodes from being perpendicular, and an overlap of nanowires. These fluctuations related to arrangement of nanowires can make nanowire characteristics depart from specification values.

SUMMARY OF THE INVENTION

The present invention has been made in view of the above, and an object of the present invention is therefore to modify characteristics of an electric device that employs nanowires.

To achieve the above-mentioned object of the invention, the present invention provides an electric device having a plurality of nanowires, characterized in that at least one of the nanowires is cut or changed in its electric characteristics so as to have a desired characteristic value of the electric device.

Preferably, the electric device is a field effect transistor that has a source electrode, a drain electrode and a gate electrode on a substrate and that uses the plurality of nanowires as conductive channels between the source electrode and the drain electrode.

An electric device assembly according to the present invention includes a plurality of electric devices each of which has a plurality of nanowires arranged on the same substrate, characterized in that at least one of the nanowires of the electric device is cut or changed in its electric characteristics.

According to the present invention, a method of manufacturing an electric device having a plurality of nanowires, comprises the steps of fabricating the electric device by using the plurality of nanowires, measuring a characteristic value of the fabricated electric device, and cutting at least one of the nanowires or changing electric characteristics of at least one of the nanowires so as to have a desired characteristic value of the electric device.

Preferably, in the manufacturing method, the step of cutting at least one of the nanowires is carried out by laser trimming.

According to the present invention, characteristics of an electric device using nanowires can be modified by cutting or changing electric characteristics of the nanowires. An electric device having nanowires, which is high-performance, can thus be manufactured through a simple, low-cost process in a large area. The present invention also makes it possible to modify characteristics of an electric device that employs nanowires and reduce characteristics fluctuations even when sophisticated nanowire arranging techniques are not available. Applied to active matrix displays, imaging devices, phase-coherent antennas, and the like, the electric device using nanowires improves the performance of these appliances.

When using a TFT device in which nanowires serve as conductive channels, the use of nanowires has the following additional effect.

A TFT device using nanowires can be trimmed while maintaining characteristics of the TFT device, unlike conventional TFT devices, which are rendered completely nonfunctional by trimming. Laser trimming, which is not usable in conventional TFT devices, is thus made employable and various advantages of laser trimming can now be utilized.

Further features of the present invention will become apparent from the following description of exemplary embodiments with reference to the attached drawings.

BRIEF DESCRIPTION OF THE DRAWINGS

FIGS. 3A and 3B are diagrams illustrating the structure of a nanowire, with FIG. 3A showing a vertical sectional view of the nanowire cut lengthwise and FIG. 3B showing a cross-sectional view of the nanowire taken along the line 3B to 3B in FIG. 3A.

FIGS. 4A, 4B, and 4C are diagrams illustrating the structure of a nanowire, with FIG. 4A showing a vertical sectional view of the nanowire cut lengthwise, FIG. 4B showing a cross-sectional view of the nanowire taken along the line 4B to 4B in FIG. 4A, and FIG. 4C showing a cross-sectional view of the nanowire taken along the line 4C to 4C in FIG. 4A.

FIG. 5 is a graph showing the drain current Id-drain voltage Vd characteristic of the nanowire TFT device in the first embodiment.

DESCRIPTION OF THE EMBODIMENTS

Figure 1:
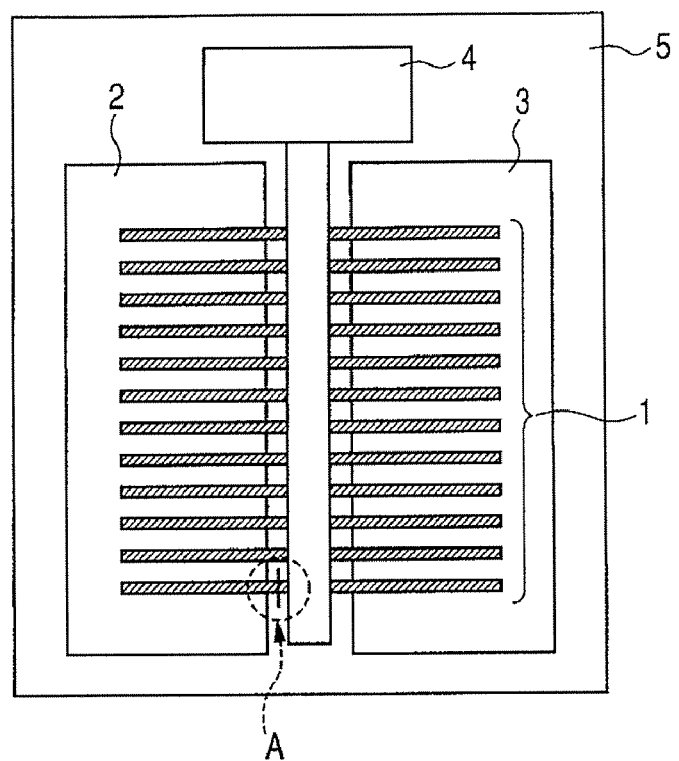
FIG. 1 is a schematic diagram illustrating the structure of a nanowire TFT device as an electric device according to a first embodiment of the present invention.

A specific description will be given below with reference to the accompanying drawings on the best embodiment mode of an electric device having nanowires according to the present invention and its manufacture method.

An electric device according to this embodiment mode has a plurality of nanowires. Characteristics of the electric device are measured, and then modified by cutting at least one of the nanowires or by changing electric characteristics of at least one of the nanowires so as to have a desired characteristic value of the electric device.

In an electric device having a plurality of nanowires, the nanowires are electrically connected in parallel to and independently of one another. Cutting or changing electric characteristics of at least one of the nanowires can perform modification without affecting the rest of the nanowires. If an approximate characteristic value per nanowire is known, how many nanowires are to be cut or changed in electrical property can be calculated to easily get closer to the desired characteristic value. This embodiment mode utilizes the fact that a characteristic peculiar to an electric device having nanowires is determined by the total number of a plurality of nanowires, and thus the characteristic is controlled by controlling the number of nanowires.

The electric device is preferably a TFT device using a plurality of nanowires as conductive channels. In this electric device which is a TFT device using a plurality of nanowires as conductive channels, TFT characteristics can have a desired value by cutting at least one of the nanowires constituting the TFT channels. To control TFT characteristics, the output characteristic (Vd-Id) and the transfer characteristic (Vg-Id) are measured by measuring the drain current Id while changing the gate voltage Vg and the drain voltage Vd. Thereafter, a suitable number of suitable nanowires are cut so that the mutual conductance is modified to a desired value, thereby enabling its control. In some cases, modification can be made by measuring the field effect mobility, the threshold voltage, the subthreshold swing or the like instead of the drain current Id, and then cutting suitable nanowires.

An electric device assembly according to this embodiment mode has a substrate on which the plurality of electric devices each having a plurality of nanowires are arranged. The electric device assembly reduces characteristics fluctuations by measuring the characteristic value of the electric devices and cutting at least one of the nanowires in an electric device whose characteristic value measured is outside of a desired range.

Characteristic fluctuations among the electric devices are thus reduced in the electric device assembly in which a plurality of electric devices are arranged on the same substrate. Specifically, nanowires are cut to make electric device characteristics fluctuate much less than before the processing.

In an electric device manufacturing method according to this embodiment mode, characteristics of an electric device that has a plurality of nanowires is measured, and then modified by cutting at least one of the nanowires, or by changing electric characteristics of at least one of the nanowires, so that the measured characteristic value of the electric device becomes a desired value.

In the manufacturing method, characteristics of an electric device that has a plurality of nanowires is modified by cutting or changing electric characteristics of at least one of the nanowires. The nanowires are electrically independent of one another, and hence a desired nanowire can be cut, or changed in electrical property, without damage to the rest of the nanowires. In addition, if the magnitude of influence on electric device characteristics per nanowire is known, which nanowire is to be cut can be determined and as a result the characteristics can have a desired value.

Preferably, laser trimming is employed in cutting at least one of the nanowires. When laser trimming is employed in cutting at least one of the nanowires, a large area can quickly be processed without affecting other places than ones that need to be trimmed.

Described below as various embodiments of an electric device having nanowires according to the present invention are cases in which the electric device is applied to a TFT device that uses nanowires as conductive channels, namely, a nanowire TFT.

First Embodiment

A first embodiment of the present invention is described with reference to FIGS. 1 to 6.

FIG. 1 is a schematic diagram of a nanowire TFT according to this embodiment. In FIG. 1, Reference Numeral 1 denotes nanowires composed of a semiconductor material, '2' denotes a source electrode, '3', a drain electrode, '4', a gate electrode, and '5', a glass substrate.

The nanowire 1 is a wire-shaped component with a diameter of several nm to several hundreds nm and a length of several µm to one hundred µm (aspect ratio: 10 to $10^4$). The nanowire 1 can have other shapes than the wire shape, including a tube shape like a carbon nanotube.

The semiconductor material of the nanowire 1 can be one selected from or a combination of Group IV semiconductors (C, Si, Ge, Sn). Group III-V semiconductors (Al, Ga, In) (N, P, As, Sb) and Group II-VI semiconductors (Be, Mg, Zn, Cd, Hg) (O, S, Se, Te) can also be employed. Also employable are combinations of the above semiconductors with other semiconductors including (Ge, Sn, Pb) (S, Se, Te), (Cu, Ag) (F, Cl, Br, I), (Cu, Ag) (Al, Ga, In, Tl, Fe) (S, Se, Te)$_2$, (Al, Ga, In)$_2$ (S, Se, Te)$_3$, $BeSiN_2$, $CaCN_2$, $ZnGeP_2$, $CdSnAs_2$, $ZnSnSb_2$, $CuGeP_3$, $CuSi_2P_3$, $Si_3N_4$, $Ge_3N_4$, $Al_2O_3$, and $Al_2CO$, wherein the parentheses are used to indicate in an inclusive manner every material made up of one of the parenthesized elements and every material that is a mixture of two or more of the parenthesized elements. The semiconductors may be doped with a suitable dopant to form a p-type semiconductor or an n-type semiconductor. The semiconductor material of the nanowire 1 in this embodiment is made of silicon (Si).

The nanowire 1 can have various structures including one in which different materials are connected in the longitudinal direction of the nanowire 1, one in which different materials are connected in the cross-sectional direction, and a combination of the two. Several examples of employable structures are shown in FIGS. 2A and 2B, FIGS. 3A and 3B, and FIGS. 4A, 4B and 4C.

Figure 2A:
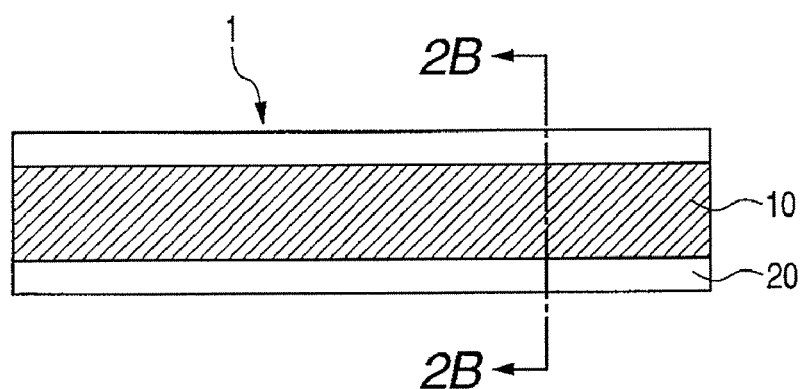
FIGS. 2A and 2B are diagrams illustrating the structure of a nanowire, with FIG. 2A showing a vertical sectional view of the nanowire cut lengthwise and FIG. 2B showing a cross-sectional view of the nanowire taken along the line 2B to 2B in FIG. 2A.

FIGS. 2A, 3A and 4A show sectional views parallel to the longitudinal direction of the nanowire 1. FIGS. 2B, 3B, 4B and 4C show sectional views of the nanowire 1 taken along the broken lines 2B-2B, 3B-3B, 4B-4B and 4C-4C in FIGS. 2A, 3A and 4A, respectively.

Figure 2B:
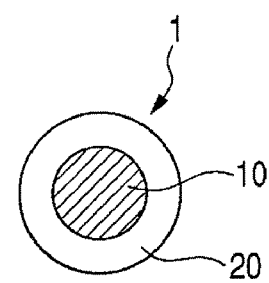

The nanowire 1 in the example of FIGS. 2A and 2B has a first core 10 which is composed of a semiconductor material and which is covered with a first shell 20 composed of a material different from that of the first core 10. The nanowire 1 in the example of FIGS. 3A and 3B has the first core 10 covered with the first shell 20, which is further covered with a second shell 30 composed of a material different from the materials of the first core 10 and the first shell 20. The nanowire 1 in the example of FIGS. 4A to 4C has the first core 10 and a second core 40, which are composed of different materials from each other, which are connected to each other in the longitudinal direction, and which are covered with the first shell 20. Any of the three structures can be employed.

The nanowire 1 in this embodiment has a silicon core covered with silicon oxide (see FIGS. 2A and 2B). In this case, the silicon core serves as a conductive channel of a TFT device and the silicon oxide cladding layer serves as a gate insulating (dielectric) layer of the TFT device.

The arrangement of the nanowire 1 is such that every nanowire 1 is oriented perpendicularly across between the source electrode 2 and the drain electrode 3, while all the nanowires 1 are placed in parallel with one another at equal intervals without an overlap. The example of FIG. 1 shows an ideal arrangement of the nanowires 1.

At least one nanowire 1 constitutes a TFT device as described above. In this embodiment, a plurality of nanowires 1 constitute a TFT device and at least one of the nanowires is cut through laser trimming, so that characteristics of the TFT device are modified as desired. How this is accomplished is described below.

The number of nanowires 1 in a TFT device that has a plurality of nanowires as conductive channels exceeds a desired number in some cases.

Accordingly, the first step is to change the gate voltage Vg and the drain voltage Vd to measure the drain current Id as an initial characteristic of the nanowire TFT. The drain current Id measured may be one corresponding to a specific gate voltage Vg and a specific drain voltage Vd. Alternatively, the saturation current Id may be measured by measuring the output characteristic (Vd-Id) and transfer characteristic (Vg-Id) of the nanowire TFT.

FIG. 5 shows a result of measuring the output characteristic (Vd-Id) of a nanowire TFT according to this embodiment. As shown in FIG. 5, the drain current Id measured when the nanowire TFT's gate voltage Vg is $Vg_0$ and drain voltage Vd is $Vd_0$ before trimming is $Id_0$. In this embodiment, the drain current Id is modified from $Id_0$ to a desired value $Id_1$ by cutting one or more nanowires 1 through trimming. The drain current per nanowire 1 is regarded as a mean value, which is $Id_0$, and approximately $((Id_0-Id_1)/Id_0)$ nanowires 1 are cut in the trimming.

A modification is made though the trimming, so that the drain current Id measured when the nanowire TFT's gate voltage Vg is $Vg_0$ and drain voltage Vd is $Vd_0$ is now $Id_1$ as shown in FIG. 5. The drain current Id can thus be controlled to be within a desired range by cutting as many suitable nanowires 1 as suitable to modify the drain current Id from the initial characteristic value $Id_0$ to the desired value $Id_1$.

This embodiment employs trimming to cut as many nanowires 1 as necessary out of the plurality of nanowires 1 of the nanowire TFT as shown in FIG. 1. The trimming for cutting the nanowires 1 is, in this embodiment, laser trimming. An image of the nanowire TFT put under a microscope is automatically picked up to trim a suitable number of nanowires 1 through laser trimming. In the schematic example of FIG. 1, one nanowire is laser-trimmed (see a cut nanowire portion A in FIG. 1).

The following description is about a method of manufacturing a field effect transistor (or a TFT device: in the present invention, a device that is constructed only partially from nanowires is also referred to as a TFT device) that has nanowires 1 according to this embodiment.

With the TFT device manufacturing method of this embodiment, a TFT device is manufactured by manufacturing nanowires 1 in advance, and then arranging the nanowires 1 on a substrate.

First, fine particles of gold each having a particle size of 20 nm are arranged on a <111> oriented silicon substrate and heated at 440° C. under vacuum (<100 mTorr), and then $SiH_4$ gas, for example, is supplied to let silicon nanowires 1 grow through a VLS (Vapor-Liquid-Solid) method. The substrate is next subjected to heat treatment in an oxygen atmosphere to perform thermal oxidation treatment on surfaces of the silicon nanowires 1. The silicon nanowires 1 are harvested by cutting them off of the silicon substrate in a manner disclosed in the article on pages 2214-2216 of "Appl. Phys. Lett." Vol. 78 issued in 2001. The obtained silicon nanowires 1 have, for example, a diameter of 20 nm and a length of 20 μm, and are surrounded by a 5-nm thick film of silicon oxide.

The silicon nanowires 1 obtained in the manner described above are dispersed in ethanol as a solvent, to thereby obtain a nanowire solution. The nanowire solution is caused to flow along a flow path by, for example, the aforementioned method in the article on pages 274-278 of "Nature" vol. 425 issued Sep. 18, 2003, so that the nanowires 1 are deposited and oriented on the substrate surface. Subsequently, the nanowires 1 in unnecessary regions are removed through photoresist application, exposure to light, and etching while leaving the nanowires in channel portions of the TFT device that have been deposited and oriented on the substrate surface.

Thereafter, a source electrode 2, a drain electrode and a gate electrode 4 are formed by an ordinary semiconductor process on the substrate having the above nanowires 1, thus completing a nanowire TFT. This nanowire TFT is structured such that the silicon nanowires 1 serve as channels while the silicon oxide dielectric layers cladding the silicon nanowires 1 serve as gate insulating layers.

The initial characteristic of the thus obtained nanowire TFT is measured and at least one of the nanowires 1 is cut through trimming in order to change the measured characteristic value to a desired value. Through the trimming, the drain current Id measured when the nanowire TFT's gate voltage Vg is $Vg_0$ and drain voltage Vd is $Vd_0$ is modified from the pre-trimming value $Id_0$ to the desired value $Id_1$ as shown in FIG. 5, for example. The number of nanowires 1 cut in the trimming is determined from, for example, the drain current per nanowire 1, which is the mean value $Id_0$, and is found to be $(Id_0-Id_1)/Id_0$. A nanowire TFT can thus have desired TFT characteristics.

In this embodiment, nanowires for conductive channels of a TFT device are used, and laser trimming to trim the TFT device is employed in the above manner. As described above, a nanowire TFT device using nanowires for conductive channels can be trimmed while maintaining its TFT characteristics unlike other TFTs which are rendered completely nonfunctional by trimming. Laser trimming, which is not applicable to conventional TFT devices, is thus made employable and various advantages of laser trimming can now be utilized.

Advantages of laser trimming include non-contact trimming, minute width machining, trimming of resistors in high-density integrated circuits, high precision and reproducibility, and little change with time. Laser trimming using YAG lasers, $CO_2$ lasers, and other similar laser light sources is effective in this embodiment.

To summarize, according to this embodiment, a TFT device whose characteristic value (drain current) lies within a desired range can be obtained by cutting a necessary number of nanowires of the nanowire TFT through laser trimming.

In this embodiment, there is described a case in which the present invention is applied to a TFT device as an electric device having nanowires, but the present invention is not limited thereto. An electric device having nanowires to which the present invention is applicable includes, for example, a resistor, a capacitor, a coil, a field effect transistor, an light emitting device, or a photodetector.

Second Embodiment

A second embodiment of the present invention is next described with reference to FIG. 6.

In the first embodiment, a case in which characteristics of a TFT device are modified when the arrangement of the nanowires 1 is ideal is described. In contrast, this embodiment deals with a case in which characteristics of a TFT device are modified when the arrangement of the nanowires 1 is irregular.

Figure 6:
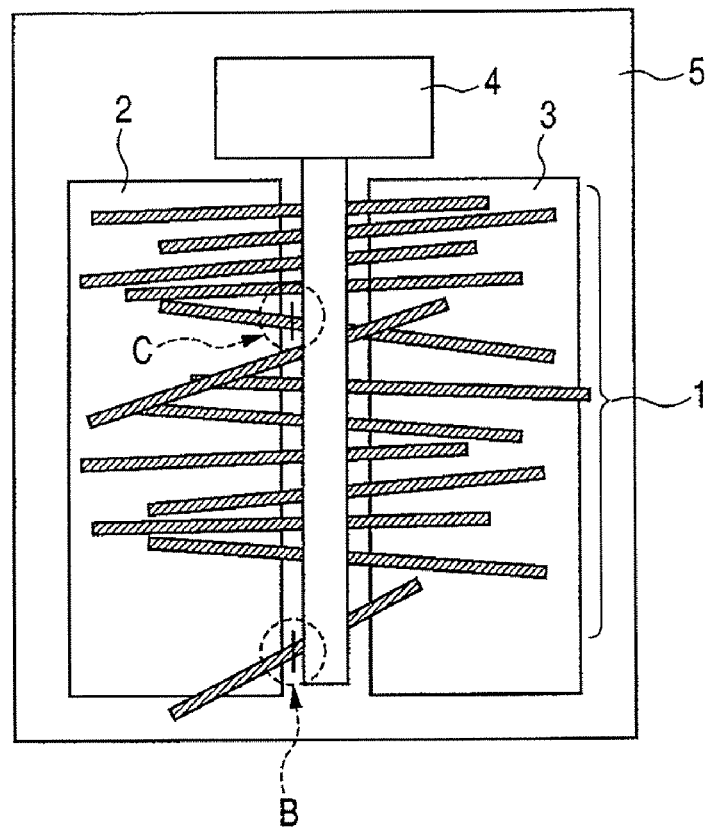
FIG. 6 is a schematic diagram illustrating the structure of a nanowire TFT device as an electric device according to a second embodiment of the present invention.

FIG. 6 is a schematic diagram of a TFT device having nanowires according to this embodiment. In FIG. 6, Reference Numeral 1 denotes nanowires formed from a semiconductor material; '2', a source electrode; '3', a drain electrode; '4', a gate electrode; and '5', a glass substrate. The structure and manufacturing method of the TFT device in the second embodiment are the same as in the first embodiment.

The example of FIG. 6 shows a case in which the value of a characteristic is degraded mainly by a defective arrangement of the nanowires 1. For instance, the channel length of a TFT and the actual channel length of the nanowire 1 sometimes do not match with each other since the angle formed between the longitudinal direction of the nanowire 1 and the longitudinal direction of the interspace between the source and drain electrodes 2 and 3 considerably deviates from being perpendicular. At the same time, the nanowires 1 sometimes overlap with one another. This case lowers the mobility, increases the threshold voltage, and increases the subthreshold swing.

Therefore, in the case where nanowires 1 that can degrade TFT characteristics are detected in a fabricated nanowire TFT, those nanowires 1 are preferentially cut through trimming. Such nanowires 1 can be found by visual inspection or by automatic image recognition with a camera using a microscope. This embodiment modifies characteristics that are degraded by identifying the nanowires 1 that are slanting and the nanowires 1 that overlap with one another through visual inspection or image processing, and then cutting the thus identified nanowires 1.

Reference symbols B and C of FIG. 6 indicate portions in which the nanowires 1 that are not oriented correctly and thus degrade device characteristics are cut, that is, nanowire cut portions. In the cut nanowire portion B, the nanowire 1 that causes characteristics fluctuations due to longer channel length and accordingly causes a smaller drain current than that of other nanowires 1 is cut. The nanowire 1 cut in the nanowire cut portion C overlaps with another one, which causes a problem in electrical connection with the gate electrode 4 and hinders effective application of the gate field.

To summarize, this embodiment obtains, in addition to the same effect as in the first embodiment, the following effect by preferentially cutting the nanowires 1 in a nanowire TFT that are not oriented correctly and thus degrade TFT characteristics in trimming the nanowire TFT.

The value of a characteristic of a TFT device (the drain current, the field effect mobility, the threshold voltage, the subthreshold swing or the like) can be maintained within a desired range.

Third Embodiment

A third embodiment of the present invention is described next with reference to FIGS. 7 and 8.

This embodiment is an application of the present invention to a nanowire TFT device assembly (an electric device assembly) in which a plurality of nanowire TFT devices structured as described in the above embodiments are arranged on the same substrate.

Figure 7:
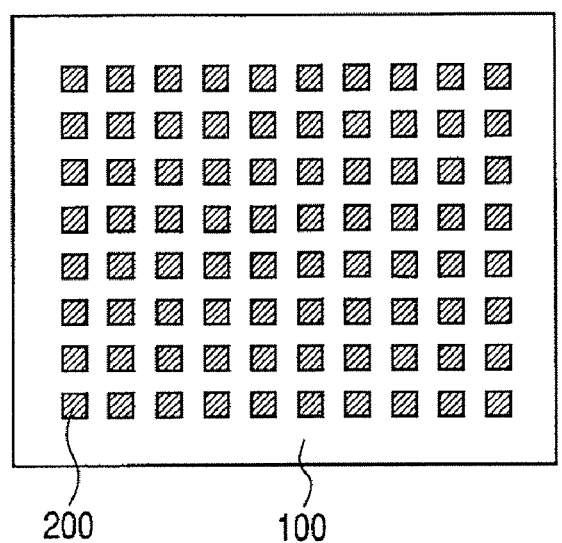
FIG. 7 is a schematic diagram illustrating the structure of a nanowire TFT device assembly which has on the same substrate a plurality of nanowire TFT devices as electric devices according to a third embodiment of the present invention.

A nanowire TFT device assembly shown in FIG. 7 constitutes a display portion of a substrate for an active matrix liquid crystal display. Switching devices having nanowire TFT devices (electric devices) 200 are two-dimensionally fabricated on a substrate 10 along row and column directions. The TFT devices 200 each have the same structure as that of the above-described nanowire TFT, and a description thereof is omitted here.

Figure 8:
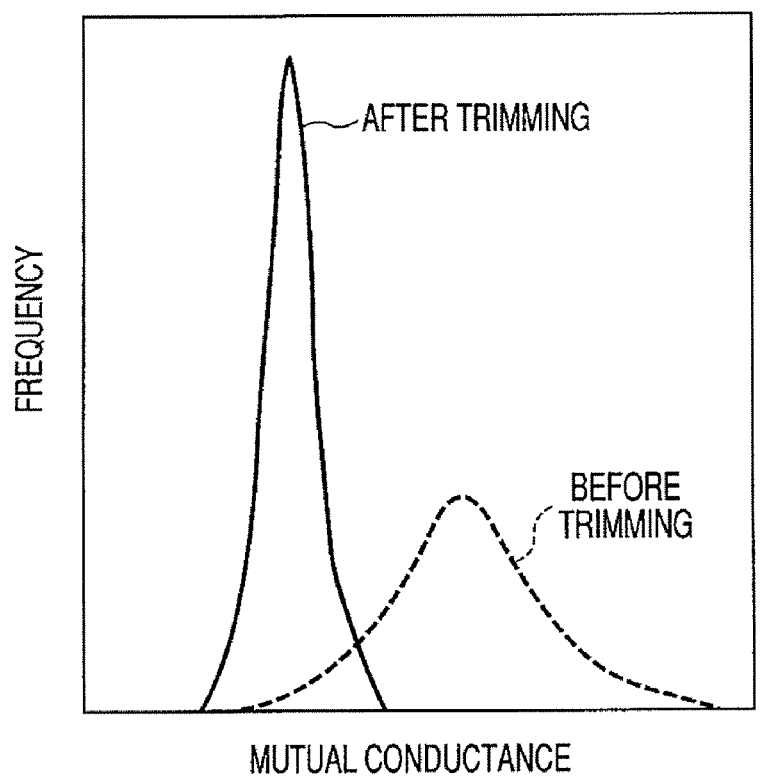
FIG. 8 is a graph showing a change in characteristics distribution (frequency distribution of mutual conductance) before and after laser trimming of the nanowire TFT device assembly shown in FIG. 7.

FIG. 8 shows the frequency distribution of the mutual conductance of each nanowire TFT device 200 illustrated in FIG. 7. FIG. 8 shows a change in characteristic distribution before and after nanowire modification (before and after trimming). FIG. 8 proves that cutting one or more nanowires of each TFT device 200 through trimming holds the characteristic distribution of each TFT device 200 within an acceptable range and reduces fluctuations in mutual conductance of each nanowire TFT device 200. To effectively utilize this effect, the characteristic value is adjusted to a given value by setting the number of nanowires in the nanowire TFT device 200 before modification larger than a given number and then cutting the excess nanowires through trimming.

To summarize, according to this embodiment, characteristics fluctuations of each of nanowire TFT devices arranged on the same substrate in a nanowire TFT device assembly can be held within an acceptable range. Thus TFTs are obtained which can provide uniform image quality throughout the entire display portion of a display substrate.

Fourth Embodiment

A fourth embodiment of the present invention is described next with reference to FIG. 9.

This embodiment is an application of the present invention to a substrate for a liquid crystal display as an example of an electric device assembly in which electric devices of different types are arranged on the same substrate. The liquid crystal display device has, in addition to a TFT device provided for each pixel, a driver circuit, which is composed of a shift register and others.

Figure 9:
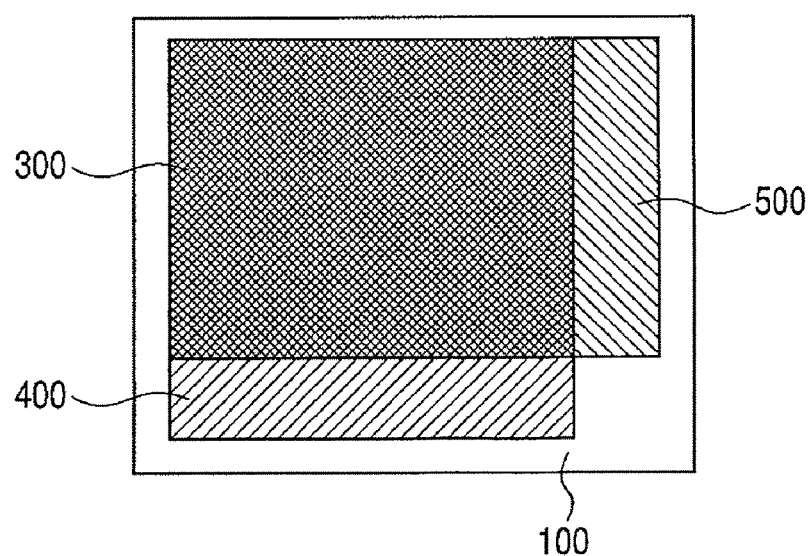
FIG. 9 is a schematic diagram illustrating the structure of a substrate having driving circuits and a nanowire TFT device assembly, which has on the same substrate a plurality of nanowire TFT devices as electric devices according to a fourth embodiment of the present invention.

An electric device assembly shown in FIG. 9 has a substrate on which a nanowire TFT device assembly (an electric device assembly) 300 similar to the one described in the above embodiment is fabricated, and a first driver circuit 400 and a second driver circuit 500 are formed in the periphery of the nanowire TFT device assembly 300. The first driver circuit 400 and the second driver circuit 500 are semiconductor circuits composed of shift registers and others to drive nanowire TFTs. The nanowire TFT device assembly 300 has the same structure as that of the nanowire TFT device assembly in the third embodiment, and a description thereof is omitted here.

This embodiment deals with an application to a liquid crystal display substrate, but the present invention is not limited thereto and is also applicable to a substrate for an organic light emitting display, for example. The substrate for an organic light emitting display has, in each pixel, two or more TFTs including a switching TFT for switching on/off the light emission of the pixel and a driving TFT for letting a current flow into the device. Driver circuits composed of shift registers and others are placed in the periphery of the display area of the substrate for an organic luminescence display. The electric device assembly of this embodiment is also applicable to such a substrate for an organic luminescence display.

This embodiment describes a case in which at least one of a plurality of nanowires in an electric device is cut so that the characteristic value of the electric device becomes a desired characteristic value. However, the present invention is not limited thereto. For instance, electric characteristics of one or more nanowires in an electric device having the plurality of nanowires may be changed so that a characteristic value of the electric device becomes a desired characteristic value. The electrical characteristic change in this case is, for example, acquisition of insulating properties, or raising or lowering of the resistance.

Specifically, heat treatment, oxidation, hydrogenation, plasma treatment, ion implantation, or the like is performed to cause such a change in electric characteristics.

As described above, the present invention is applicable to an electric device having nanowires, e.g. a TFT device in which nanowires serve as conductive channels, an electric device assembly with a plurality of such electric devices arranged on the same substrate, and a method of manufacturing the electric device. Application examples of the present invention include substrates for active matrix displays such as liquid crystal displays and organic luminescence displays, imaging devices, and phase-coherent antennas.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application No. 2005-352574 filed on Dec. 6, 2005, which is hereby incorporated by reference herein.

What is claimed is:

1. A method of manufacturing an electric device assembly in which a plurality of electric devices each having a plurality of nanowires are arranged, the method comprising:
    fabricating the plurality of electric devices by using the plurality of nanowires;
    measuring a characteristic value of each fabricated electric device; and
    conducting trimming on an electric device, among the plurality of electric devices, whose characteristic value is measured to be outside of a desired range by subjecting at least one of the plurality of nanowires, corresponding to that electric device, to a treatment selected from a group that includes heat treatment, oxidation, hydrogenation, plasma treatment, and ion implantation, thereby changing electric characteristics of the at least one of the plurality of nanowires,
    wherein the characteristic value of the electric device subjected to the trimming is set within the desired range by the trimming to reduce characteristic fluctuations among the plurality of electric devices.

* * * * *